United States Patent
Senthilkumar et al.

(10) Patent No.: US 6,791,428 B2
(45) Date of Patent: Sep. 14, 2004

(54) DUTY CYCLE TUNER FOR LOW POWER REAL TIME CLOCK OSCILLATOR

(75) Inventors: Chinnugounder Senthilkumar, Folsom, CA (US); Tea Lee, Folsom, CA (US); Robert Fulton, Folsom, CA (US); Andrew Volk, Granite Bay, CA (US); Harishankar Sridharan, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/331,805

(22) Filed: Dec. 30, 2002

(65) Prior Publication Data

US 2004/0124934 A1 Jul. 1, 2004

(51) Int. Cl.$^7$ ................................................ H03B 5/32

(52) U.S. Cl. ........................................ 331/158; 331/74

(58) Field of Search ............................ 331/74, 158, 47, 331/139; 368/10, 200; 327/172, 175, 176; 713/500, 503

(56) References Cited

U.S. PATENT DOCUMENTS

| | | | | | |
|---|---|---|---|---|---|
| 4,205,279 A | * | 5/1980 | Beutler | ........................ | 331/111 |
| 5,829,008 A | * | 10/1998 | Podkowa et al. | ............... | 711/5 |
| 5,860,125 A | * | 1/1999 | Reents | ........................ | 713/320 |
| 6,084,452 A | * | 7/2000 | Drost et al. | ................. | 327/175 |
| 6,134,187 A | * | 10/2000 | Tomiyasu | ..................... | 368/28 |
| 6,304,517 B1 | * | 10/2001 | Ledfelt et al. | ................. | 368/10 |
| 6,320,437 B1 | * | 11/2001 | Ma | ............................ | 327/175 |
| 2002/0140478 A1 | * | 10/2002 | Fletcher et al. | ............. | 327/175 |
| 2003/0122629 A1 | | 7/2003 | Fulson et al. | | |
| 2003/0132809 A1 | * | 7/2003 | Senthilkumar et al. | ..... | 331/100 |

* cited by examiner

Primary Examiner—Robert Pascal
Assistant Examiner—Joseph Chang
(74) Attorney, Agent, or Firm—Blakely, Sokoloff, Taylor & Zafman LLP

(57) ABSTRACT

A circuit for producing a reliable duty cycle for a low power oscillator. The circuit produces a square wave signal based on the differences between the oscillating output signal driven by a piezoelectric crystal and a phase shifted output signal. This circuit provides a quick start for a clock signal, generates a reliable fifty percent duty cycle and is better protected from common mode noise. This circuit can also be configured to be programmable to provide for an adjustable duty cycle.

23 Claims, 5 Drawing Sheets

DUTY CYCLE TUNER FOR LOW POWER REAL TIME CLOCK OSCILLATOR

BACKGROUND

(1) Field of the Invention

The invention relates to oscillators. More specifically, the invention relates to duty cycle tuning for oscillator circuits.

(2) Background

Clock circuits are an essential component of modern computer systems. These circuits generate a regular series of pulses based on a piezoelectric crystal, which governs the frequency of the pulses. The clock signal that is generated is used to synchronize the operation of the other components and circuits in the system. For example, on a conventional motherboard for a personal computer a real time clock (RTC) and crystal oscillator circuit reside on the mother board to provide an consistent oscillating output signal to be used as the main clock by motherboard components such as an I/O controller hub (also known as a "south-bridge"). A clock signal can be divided or multiplied to get seconds, minutes and hours to be used by a system for tracking the actual time (e.g., 7:05 am Dec. 21, 2002).

A crystal oscillator circuit generates sinusoidal oscillations across an LC tank, which are converted into a square waveform (i.e., clock signal), often using a biased analog inverter (i.e., a sine-to-square wave converter). This inverter trips at a designed trip point and the resulting duty cycle (the period during the clock cycle that the clock signal is 'high') of the generated clock signal is highly dependent on the trip point and the amplitude of the input waveform. During the start-up of a system, oscillations across a crystal slowly develop and continue to grow in amplitude until they reach a steady state (e.g., a constant amplitude). This start-up process often takes from several hundred milliseconds to a few seconds. The time needed to reach a steady state is determined by the crystal characteristics such as manufacturing variations, crystal type and the properties of an associated amplifier circuit. This start-up process in terms of computing time involves a considerable delay. Also, this start-up process often results in the generation of unreliable clock signals during the time before a steady state is obtained. This requires that circuits and components that rely on the clock signal must be designed to ignore clock signals during this initial period or otherwise shielded from these unreliable signals. For example, an RTC is often used as a system reference clock for a south-bridge. The south-bridge requires a clock signal having a duty cycle that is greater than 30% (i.e., the clock signal is high for at least 30% of a given cycle) from the time the south-bridge is powered on. However, because the use of all crystal oscillators involves a start-up process that results in the generation of unreliable clock signals the south-bridge must employ circuitry to filter out the clock signals during this period. Clock pulses generated by the sine-to-square wave converter during start-up may have a duty cycle as low as 0.01%. These runt clock pulses may place the logic state machines of a component like the south-bridge into a state of meta-stability, which is a state where a circuit fluctuates between logic states and ultimately results in an undeterminable logic state. One solution to avoid meta-stability problems is for components that rely on a system clock to 'count' for a predetermined time period after start before accepting the clock signal for use in logic state machines. This solution requires that components relying on the clock signal have special circuitry to implement this count. This makes the circuits larger, more complex and more costly.

The boot up operation of a computer system is reliant upon the establishment of a reliable system clock. Establishing this reliable signal adds additional time to the boot up process for a system. Also, for systems that switch between a low power and high power state such as personal computers, laptops, and hand held devices having to reestablish a reliable clock signal diminishes the responsiveness of the system.

Even when a clock signal has been established in a steady state, the resulting duty cycle cannot be predicted. The inability to predict or control a resulting duty cycle requires that logic state machines be designed to operate within a range of duty cycle times that cover the error margin for the duty cycle of an oscillator circuit. This requires the logic state machines to have additional circuitry to compensate for shortened or lengthened duty cycles.

BRIEF DESCRIPTION OF THE DRAWINGS

Embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
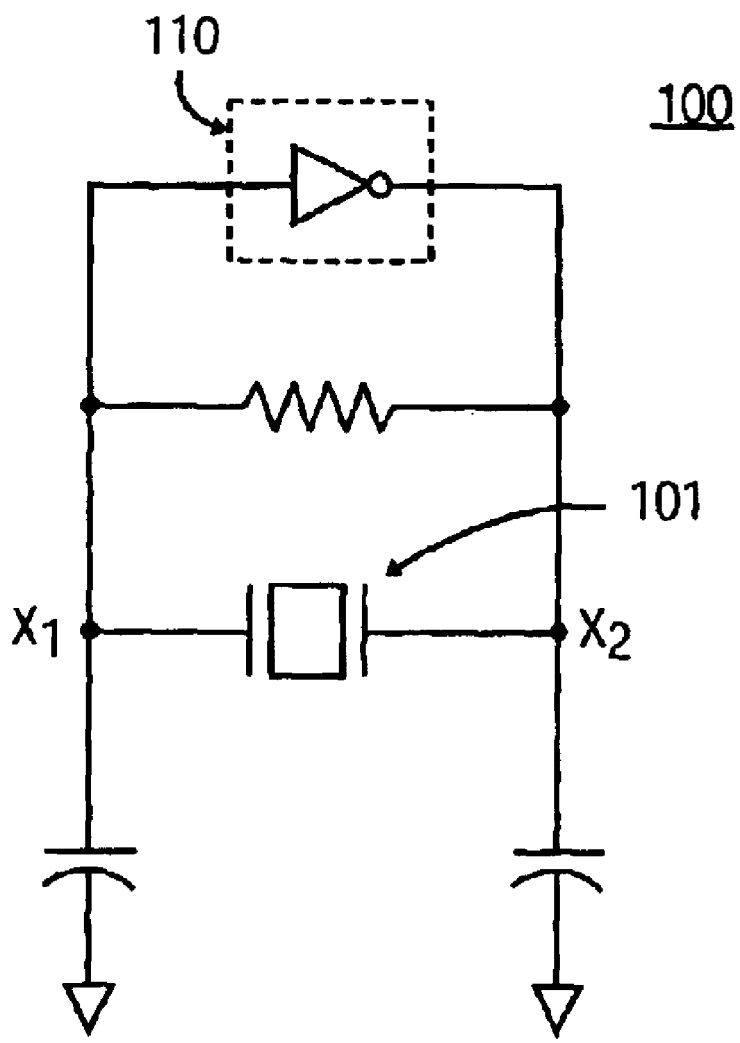
FIG. 1 is a circuit diagram of a conventional oscillator circuit.

FIG. 1 illustrates a conventional piezoelectric crystal oscillator circuit 100 that generates a sinusoidal waveform at $X_1$ and $X_2$. The crystal 101 vibrates at a precise frequency that determines the frequency of the sinusoidal waveform that is generated by the piezoelectric crystal circuit 100. The piezoelectric crystal 101 is often a thin wafer of a quartz crystal. The physical characteristics of the crystal 101 preclude it being placed on a die of an integrated circuit. Some elements of the piezoelectric crystal circuit 100 such as the inverter 110 may be placed on die even though the crystal 101 is off die.

Figure 2:
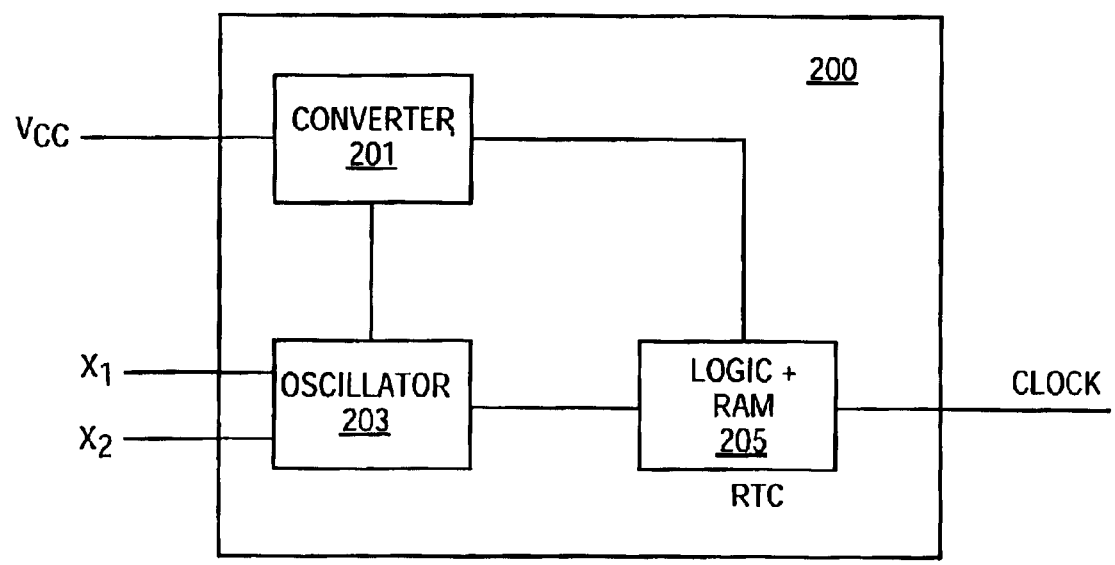
FIG. 2 is a block diagram of a real-time clock.

FIG. 2 is a block diagram of one embodiment of a real-time clock (RTC) component 200. RTC 200 may be a separate component on a motherboard and connected by a bus to other components. In another embodiment, RTC 200 is a part of an I/O controller circuit (e.g., a "south bridge"). Power converter 201 adjusts the voltage level of the power source Vcc to a voltage level appropriate for each of the other components including oscillator circuit 203 and logic and memory circuitry 205. In one embodiment, power converter 201 is a direct current (DC) to DC converter 201. DC to DC converter 201 steps down the voltage of the motherboard, 3.3 volts, to approximately 1 volt. The oscillator circuit 203 and logic and memory circuit 205 are designed to operate at a lower voltage in order to draw less current and consume less power. In one embodiment, RTC 200 draws power from a cell battery on the motherboard when the computer system is not in operation, powered on or plugged into a power outlet. Drawing a reduced current from the battery extends the life of the battery and thereby preserves the information stored in the RTC (e.g., the actual time) and other components that rely on the battery when the system is powered off such as the basic input output system (BIOS).

The logic and memory circuitry 205 perform a number of well known functions, including calculating and storing actual time. This circuitry continues to run even when the remainder of the computer system is shut down in order to preserve key information and functions that will be needed when a system is restarted. In one embodiment, logic and memory circuitry 205 store data and functions that are used during start-up, recovery or when primary power is unavailable. In one embodiment, memory 205 stores basic input output system (BIOS) information, wake up information and functions, soft reboot information, alarm functions and similar data and instructions. Logic and memory components 205 are driven by the output clock signal from oscillator circuit 203 and powered by power conversion circuit 201. In one embodiment, logic and memory circuit 205 receives the square wave signal from the oscillator circuit and outputs a clock signal. In one embodiment, the clock signal has a frequency of 32.768 kHz.

In one embodiment, improved oscillator circuit 203 in conjunction with the piezoelectric crystal 100 generates a sinusoidal wave on lines $X_1$ and $X_2$. Improved oscillator circuit 203 outputs a square wave signal to the logic and memory circuit 205. Improved oscillator circuit 203 is designed to eliminate the generation of spurious signals during its start-up process. The start-up process occurs on initial system power up, insertion of the on board battery, or similar power restoration scenarios. Generating a reliable clock signal during a start up sequence allows other components (e.g., logic and memory circuitry 205) to be less complex and require less space on the die of an integrated circuit. In one embodiment, the initial delay to generate a reliable self-bias circuit steady state in a conventional oscillator circuit can range from 1 to 10 microseconds dependent on the current level in the self-bias circuit. After the self-bias circuit reaches a steady state, additional time is required to generate an oscillating signal of sufficient amplitude to produce clock edges. This delay is greater that 10 milliseconds. After clock edges are produced, establishing a reliable duty cycle requires at least an additional 100 milliseconds.

In one embodiment, improved oscillator 203 is able to generate a reliable clock edge and duty cycle within 100 microseconds of the self-bias circuit reaching a steady state. This, significantly reduces the boot up time for a system, reduces component complexity and cost. In one embodiment, improved oscillator 203 also produces a clock signal with a stable and predictable duty cycle of fifty percent. This reduces the risk of meta-stability being induced in a component relying on the clock output, thereby improving system stability.

Figure 3:
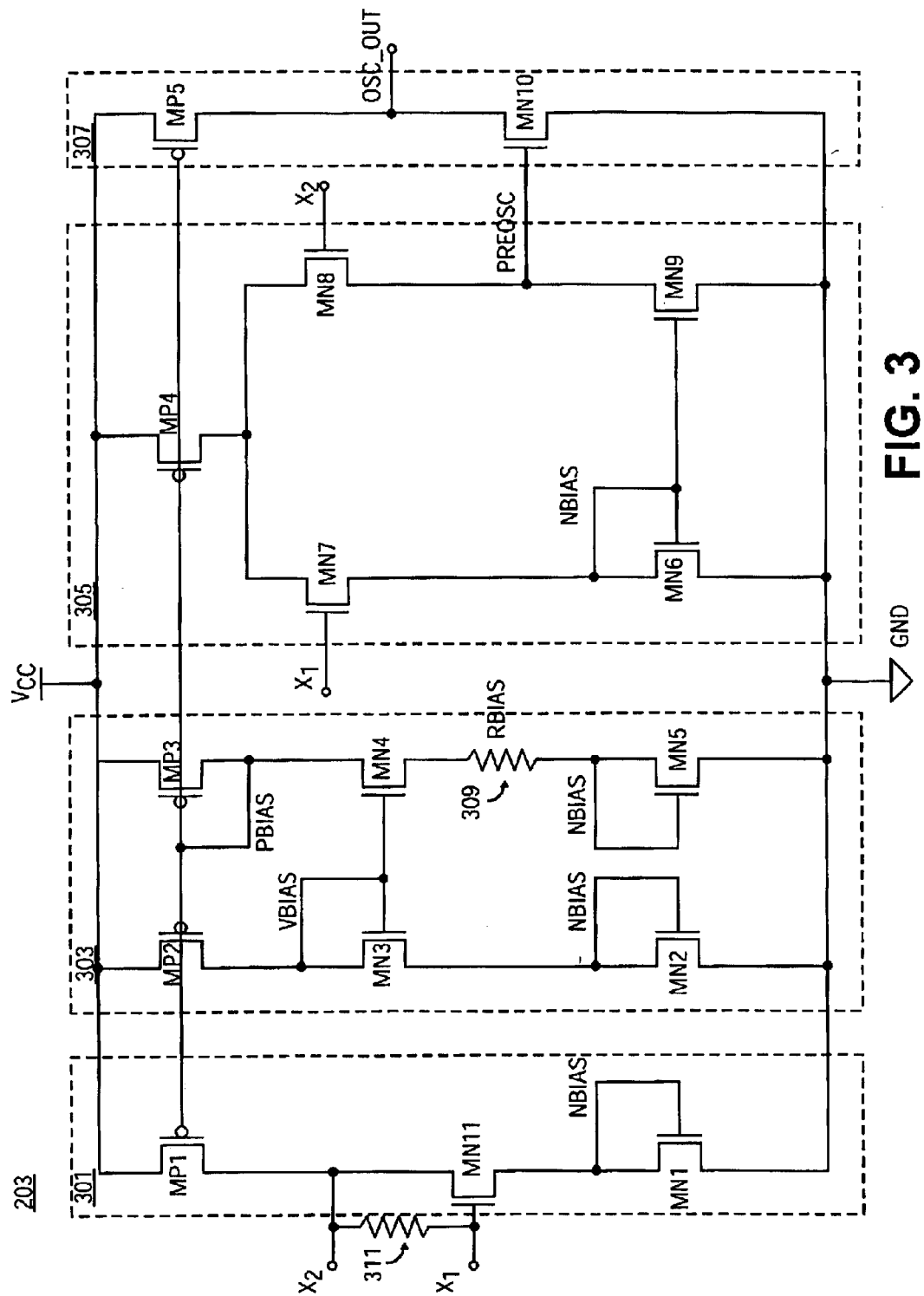
FIG. 3 is a circuit diagram of a duty cycle tuning circuit.

FIG. 3 is a circuit diagram of one embodiment of the improved oscillator circuit 203. The improved oscillator circuit 203 includes an amplifier circuit 301, self-bias loop circuit 303, duty cycle tuning circuit 305 and wave shaping circuit 307. In one embodiment, the oscillator circuit 203 is connected to a piezoelectric crystal feedback circuit 100.

Self-bias loop circuit 303, generates a constant reference current based on weak inversion operation. This reference current across transistors MP2 and MP3 is driven by the signal Pbias. Pbias is generated independent of the Vcc voltage level. The Rbias level of the resistor 309 and the characteristics (e.g., size in terms of the length and width) of transistors MP2, MP3, MN3 and MN4 determine the current level of self-bias loop circuit 303. The current $I_1$ in self-bias circuit 303 can be expressed as:

$$I_1 = V_T/Rbias * ln(m*k),$$

Where, $V_T$=Thermal voltage (26.5 mV @ 300K)

Rbias=Biasing Resistor 309

$m = \beta_3/\beta_1$ $k = \beta_2/\beta_4$ $\beta_{1-4}$ are the devices sizes of the respectively numbered transistors where the device size is the ratio of width over length.

In one embodiment, self-bias circuit 303 generates the signal Pbias, which drives the current levels of the other subcomponents through the transistors MP1, MP4 and MP5. This circuit also generates the Vbias signal. Vbias and Pbias are used to mirror bias currents to other sub-components including the piezoelectric crystal feedback circuit 100. The matching of the size and characteristics of mirrored devices across oscillator circuit 203 allows the establishment of the matching currents. In one embodiment, transistor sets MN3/MN11/MN7/MN8, MP1/MP3/MP4/MP5 and MN1/MN2/MN5/MN6/MN9/MN10 have matching current densities within each set. Matching of transistors MP1, MP3, MP4 and MP5 allows the control of the relative current ratios between the legs of oscillator circuit 203, which in turn allows, for example, the mirrored currents produced by self-bias loop circuit 303 to set the DC bias levels for the crystal oscillation signals $X_1$ and $X_2$ by driving transistor MP1 with the Pbias signal. In one embodiment, MN3, MN11, MN7 and MN8 have matching current densities because transistors MN11, MN7 and MN8 function to match drive strengths in their respective circuits in line with Vbias and MN3.

The mirroring of current densities across circuit 203 provides robustness and consistency over varying process-voltage-temperature (PVT) variations, which allows the generation of a reliable clock signal. Controlling the current levels in circuit 203 using Pbias and transistors MP1–MP5 tightly restrains the overall power consumption of the circuit. In one embodiment, the circuit 203 draws a current of approximately 50 nano-amperes per leg or 750 nano-amperes total current and consumes approximately 750 nano-Watts. In another embodiment, the circuit 203 can be scaled to draw any current amount and produce any reference current greater than 50 nano-amperes.

In another embodiment, circuit 203 does not include a self-bias loop circuit 303. A component external to circuit 203 provides a Vbias or Pbias signal (depending on whether a ground or Vcc referenced signal is needed) that is used to mirror current among the remaining subcomponents in the circuit 203. Generating the Vbias or Pbias signal external to circuit 203 can reduce the space required on die, avoid duplicative circuitry, reduce power consumption. Including self-bias 303 on die and in close proximity to duty cycle tuning circuit 305 reduces noise in the Pbias signal.

In one embodiment, circuit 301 is a current controlled inverter with a load resistor 311 between its input ($X_1$) and output ($X_2$), which functions as an amplifier. The load resistor 311 ensures that the loop gain of the piezoelectric crystal feedback circuit 100 is greater than one and determines the maximum output voltage level of amplifier circuit 301 at output $X_2$. In one embodiment, the gain of amplifier circuit 301 is greater than 1.0 in order to generate oscillation. The input of amplifier circuit 301 is $X_1$, which is the output of piezoelectric crystal feedback circuit 100. Amplifier circuit 301 outputs signal $X_2$, which is a signal that is phase-shifted 180 degrees from the input signal $X_1$. In one embodiment, the current density of amplifier leg 301 is three times that of self-bias loop 303 legs. Transistor MP1 has a size that is three times that of MP2 or MP3 to generate three times the reference current in the leg. Thus, transistor MP1, governed by the Pbias signal, allows a current that is 3I through amplifier circuit 301. This results in the DC bias level for $X_1$ and $X_2$ being set at Vbias.

In one embodiment, duty cycle tuning circuit 305 is similar to a differential amplifier, which receives inputs $X_1$ and $X_2$. Duty cycle tuning circuit 305 can also be characterized as a modified tail pair circuit. The circuit has a PMOS 'tail' transistor MP4 that mirrors the current level of self-bias loop 303. In one embodiment, the tail transistor MP4 is sized such that duty cycle circuit 305 has a current level that is twice that of the amplifier circuit 301. Thus, MP4 is six times the size of MP3. The current density in each leg of duty cycle tuner 305 is equal to the current density in amplifier circuit 301. This enables amplifier circuit 301 to scale along with duty cycle tuning circuit 305 to provide a consistent relationship between amplifier circuit 301 and duty cycle tuning circuit 305 over PVT variations. This improves the consistency of the clock signal generated by the oscillator circuit 203 by providing better immunity from noise and signal skew. The topology of duty cycle circuit 305 differs from a conventional differential amplifier, in at least one aspect, because the inputs drive NMOS transistors instead of PMOS transistors and the region of transistor operation is weak inversion.

In addition, in one embodiment, duty cycle tuning circuit 305 includes transistors MN6 and MN9. These transistors operate in a weak inversion saturation to function as a current mirror device. These transistors function as diodes in conjunction with MN1, MN2 and MN5 to further match current densities across each of the sub-components in combination with transistors MP1–MP5. Duty cycle circuit 305 generates the Nbias signal across the diode MN6, which is the common mode output level. In the other legs of circuit 203 Nbias can be considered a virtual ground. This is achieved by matching the current densities through transistor MN1, MN2, MN5, MN6, MN9 and MN10. In one embodiment, this set of transistors also function to double the PC levels of the $X_1$ and $X_2$ signals which improves the bias of duty cycle tuning circuit 305 and overall performance of oscillator circuit 203.

In one embodiment, if $X_1$ and $X_2$ have equal amplitude at a given instant, the DC output level of the differential output at PREOSC will be equal to the voltage at Nbias, if the current density ratio of PMOS devices match the ratio of the NMOS devices in circuit 203. If differential input voltage is input via $X_1$ and $X_2$ (i.e., either $X_1$ has a greater voltage than $X_2$ or $X_2$ has a greater voltage than $X_1$) then the magnitude of the differential voltage input is developed across node PREOSC. The current sourced by MP4 is split across the two legs of duty cycle circuit 305, but the voltage at PREOSC dynamically adjusts to match the drive strengths of transistors MN7 and MN8 based on the input voltages $X_1$ and $X_2$.

When the input $X_1$ increases in voltage, $X_2$ will decrease because the two inputs are sinusoidal waves that are 180 degrees phase-shifted one from the other. An $X_1$ voltage increase results in increased current flow through MN7 and MN6 and also results in the Nbias level increasing. The Nbias signal drives MN9 connecting PREOSC to ground. $X_2$ will be decreasing when $X_1$ increases thereby rapidly cutting off current through MN8 and thereby generating a 'low' signal at PREOSC. When $X_1$ decreases $X_2$ increases. $X_1$ cuts off current through MN7 and consequently MN6 and MN9. $X_2$, however, opens MN8 driving PREOSC 'high'. The topology of duty cycle circuit 305 exploits the very high gain property of weak inversion regime operation. Small changes in $X_1$ and $X_2$ result in large changes in the distribution of the 6I current flow between the two legs of duty cycle tuning circuit 305. As a result, the signal PREOSC is a squared rail to rail signal output to shaper circuit 307. A rail to rail signal transitions between two voltage levels. These signals are commonly used in digital systems.

The result of this configuration is that common mode noise on $X_1$ and $X_2$ is rejected. Common mode noise is problematic for signals $X_1$ and $X_2$ because these signals originate in an off die component, piezoelectric crystal circuit 100, on the motherboard, and are subject to noise sources on the board over the length of the connecting wires. $X_1$ and $X_2$ are 180 degrees out of phase with one another and amplifier circuit 301 gain is slightly greater than one. In one embodiment the gain ranges from 1.01 to 1.05. Thus, a 50% duty cycle is produced from the moment oscillation begins and within 10 microseconds of the start-up. The oscillation need not reach a steady state in order to produce a reliable clock signal because the clock signal is generated based on the relative difference between $X_1$ and $X_2$ and does not require that the oscillation reach a threshold amplitude.

Figure 4:
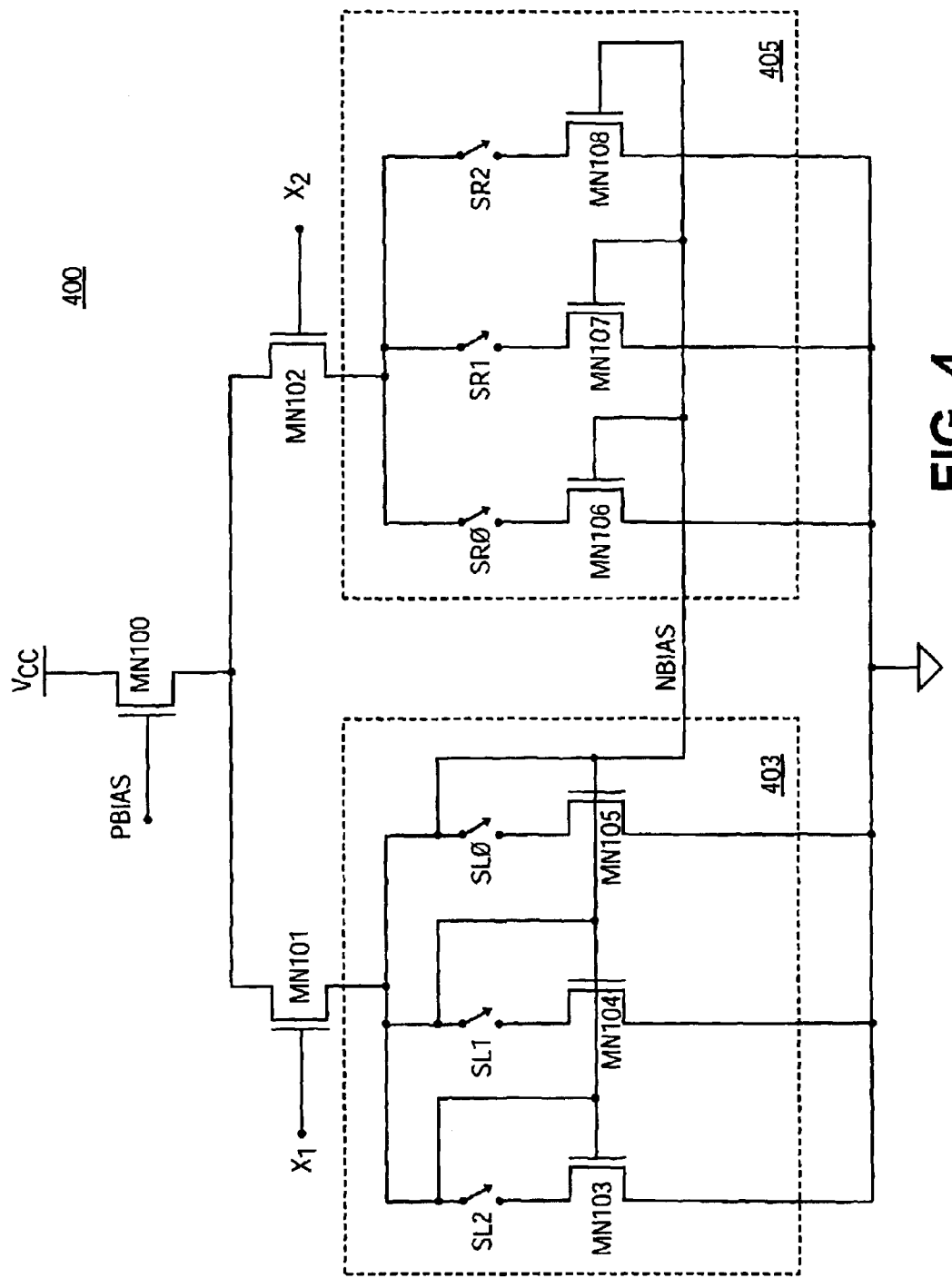
FIG. 4 is a circuit diagram of a programmable duty cycle tuning circuit.

In one embodiment a current controlled wave shaping circuit 307 is used to ensure that the output clock signal is a rail to rail signal. The shaper circuit 307 receives the output signal PREOSC from duty cycle tuning circuit 305 and outputs a clock signal. The shaper circuit 307 functions as a low power inverter, current controlled inverter, analog inverter or similar device. The trip point for MN10 is Nbias and MP5 is sized to match MP2 and MP3 and thus has known current level based upon overall symmetry of circuit 203 and the reference signal Pbias that is used to mirror current levels in each leg of circuit 203. FIG. 4 is a circuit diagram of one embodiment of a programmable duty cycle tuner 400. The current supplied to the programmable duty cycle circuit 400 is controlled by the Pbias signal at transistor MN100. Programmable circuit 400 functions in the same manner as duty cycle tuning circuit 305 to produce a squared signal based upon the relative differences in $X_1$ and $X_2$. In one embodiment, the programmable duty cycle circuit includes a right leg 405 and left leg 403. The right leg includes switches SR0–SR2 and transistors MN106–MN108. The left leg has an equivalent number of switches SL0–SL2 and transistors MN103–MN105. In one embodiment, controlling the current flow through each leg of the programmable circuit 400 can create an asymmetrical duty cycle. Altering the current flow using switches SR0–SR2 and SL0–SL2 provides a controlled means for adjusting the duty cycle. For example, if more connections are "turned on" by switches in left leg 403 than in right leg 405, then it takes less current in right leg 405 to make the output PREOSC go from a low to high in comparison to a symmetrical circuit. Decreased current is required because right leg 405 has fewer devices "on", resulting in a higher impedance in right leg 405 and therefore requiring less current to make a bigger voltage. The level of granularity in the adjustment of the duty cycle is dependent on the size of the transistors MN100–MN108 and the number of transistors used in each leg. In one embodiment, programmable circuit 400 having six switches (three right side switches SR0–SR3 and three left side switches SL0–SL3) provides nine levels of programmable asymmetry for the duty cycle. The switches used can be thermometric or binary weighted devices. In one embodiment, programmable circuit 400 can have any number of switches to provide varying levels of control over the duty cycle. The switches can be distributed unevenly between left leg 403 and right leg 405. The devices MN103–MN108 in leg 403 and leg 405 must be balanced in terms of size and number such that the current densities match through each leg. Thus, the sum of current over the device size for each set of devices in legs 403 and 405 must be equal. In one embodiment, programmable circuit 400 is monitored by an external program and coupled to processing and memory circuitry. The external program can adapt the duty cycle dynamically based on predetermined conditions, variations in the observed duty cycle, user input or similar parameters.

Figure 5:
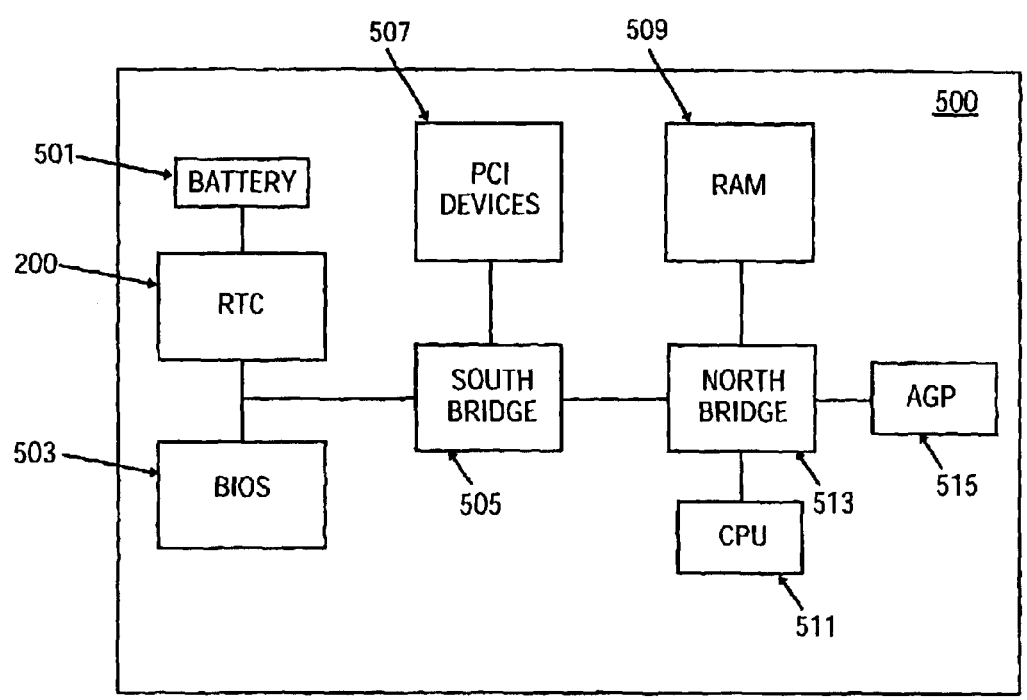
FIG. 5 is a block diagram of a motherboard having a real-time clock circuit.

FIG. 5 is a block diagram of one embodiment of a motherboard 500 (also referred to as a mainboard) including an RTC circuit 200. RTC circuit 200 is connected to an on board battery 501 which provides a constant power source for the RTC even when the power to the motherboard 500 is off. RTC 200 is also connected via a bus or similar structure to a basic input/output system ("BIOS") chip 503 and to an I/O controller hub chip ("south bridge") 505. The RTC provides a system clock and the actual time to the BIOS chip, which stores information related to the input and output systems of motherboard 500 and stores critical information related to the system necessary for start up. The BIOS 503 also relies on battery 501 when the system is powered off. Thus, the failure of battery 501 can result in the loss of critical information related to the system and require a user of the system to restore this information on each start up of the system until battery 501 is replaced. This restoration of the lost BIOS 503 information is, at the least, inconvenient for a user. Users having little familiarity with BIOS 503 are likely to be unable to correct this problem without expert assistance. In one embodiment, RTC 200 is placed on the same chip as south bridge 505. South bridge 505 generally handles communication between the I/O devices connected to motherboard 500 including PCI devices 507 connected to the mother board by a set of slots for connecting printed circuit boards (PCB) to motherboard 500. South bridge 505 communicates with the system controller ("north bridge") 513. North bridge 513 controls communication between memory 509, cache, CPU 511, advanced graphics ports (AGP) 515, if present, and south bridge 505.

RTC 200 and oscillator circuit 203 can be used in connection with any system that uses a clock signal. For example, RTC 200 or oscillator 203 could be used in connection with handheld computing devices, cell phones, pagers, network devices, wristwatches and similar devices that use a system clock. RTC 200 and oscillator circuit 203 provide a reliable duty cycle and quick response. RTC 200 and oscillator circuit 203 reduce overall circuitry needed for an electronics device and reduce the cost of producing an electronics device. One of ordinary skill in the art would understand that the circuit 203 can also be used in connection with ultra low power low frequency signaling.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
    a tuning circuit to receive a first signal and second signal from an oscillator circuit, the tuning circuit to generate a first square-wave output based on a relative voltage difference of the first signal and the second signal from the oscillator circuit, the first signal phase shifted to generate the second signal.

2. The apparatus of claim 1, further comprising:
    a self-biasing circuit to generate a first reference current.

3. The apparatus of claim 1, further comprising:
    a wave shaping circuit to invert the first square-wave output and generate a second square-wave output in a defined voltage range.

4. The apparatus of claim 2, further comprising:
    an amplifier circuit to receive an input from an oscillator circuit;
    a current source coupled to the amplifier circuit, the current source to be controlled by the self-biasing circuit.

5. The apparatus of claim 2, further comprising:
    a plurality of transistors to control current densities in the tuning circuit and the self-biasing circuit.

6. The apparatus of claim 2, further comprises:
    a current source coupled to the tuning circuit, the current source to be controlled by the self-biasing circuit.

7. The apparatus of claim 1, wherein the tuning circuit generates a fifty percent duty cycle.

8. An apparatus comprising:
    a bus;
    an input output controller coupled to the bus;
    a power node;
    a power converter coupled to the power node; and
    a real-time clock circuit coupled to the power converter and the input output controller, the real-time clock circuit to provide a clock signal to logic circuits, the real-time clock circuit includes a tuning circuit to receive a first signal and second signal from an oscillator circuit and to generate a first square-wave output based on the relative voltage of the first signal and the second signal from the oscillator circuit, the second signal a phase shifted first signal.

9. The apparatus of claim 8, further comprising:
    a power source coupled to the power node.

10. The apparatus of claim 9, wherein the power source is a battery.

11. The apparatus of claim 8, wherein the real-time clock comprises:
    a self-biasing circuit to generate a first reference current.

12. The apparatus of claim 8, wherein the real-time clock comprises:
    a wave shaping circuit to invert the first square-wave output and generate a second square-wave output in a defined voltage range.

13. The apparatus of claim 11, wherein the real-time clock comprises:
    an amplifier circuit coupled to the power node, the amplifier circuit to receive input from an oscillator circuit, wherein current from a power node to the amplifier circuit is controlled by the self-biasing circuit.

14. The apparatus of claim 11, wherein the tuning circuit is coupled to a current source from the power node, the current source controlled by the first reference circuit.

15. The apparatus of claim 9, wherein the tuning circuit generates a fifty percent duty cycle.

16. The apparatus of claim 8, further comprising:

a plurality of switches to adjust the duration of a duty cycle of the first square-wave output.

17. An apparatus comprising:

a means for generating an oscillating signal; and a means for controlling the duty cycle of the oscillating signal based on the relative voltage difference between the oscillating signal and a phase shifted oscillating signal.

18. The apparatus of claim 17 further comprising:

a means for generating a self-biasing reference current.

19. The apparatus of claim 17, further comprising:

a means for adjusting the duty cycle of the oscillating signal.

20. A method comprising:

generating an oscillating signal across a crystal;

shifting the oscillating signal to produce a second signal; and generating a square wave signal based on the relative amplitude difference of the oscillating signal and the second signal.

21. The method of claim 20, further comprising:

generating a reference current; and mirroring the reference current to a square wave generating circuit.

22. The method of claim 21, further comprising:

mirroring the reference current to an amplifier circuit, and scaling a current in an amplifier circuit with a current in the square wave generating circuit.

23. The method of claim 22, further comprising:

setting a switch to adjust a duty cycle of the square wave signal.

* * * * *